(12) United States Patent
Hsu et al.

(10) Patent No.: US 8,671,383 B2
(45) Date of Patent: Mar. 11, 2014

(54) VIEWING AND DEBUGGING HDL DESIGNS HAVING SYSTEMVERILOG INTERFACE CONSTRUCTS

(75) Inventors: Chih-Neng Hsu, Zhutian Township, Pingtung County (TW); I-Liang Ling, Zhubei (TW); Qi Guo, FuJian (CN)

(73) Assignees: Synopsys Taiwan Co., Ltd., Hsinchu Hsien (TW); Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/443,523

(22) Filed: Apr. 10, 2012

(65) Prior Publication Data

US 2013/0047134 A1 Feb. 21, 2013

Related U.S. Application Data

(60) Provisional application No. 61/524,679, filed on Aug. 17, 2011.

(51) Int. Cl.
*G06F 17/50* (2006.01)

(52) U.S. Cl.
USPC .......................................................... 716/139

(58) Field of Classification Search
USPC .......................................................... 716/139
See application file for complete search history.

(56) References Cited

U.S. PATENT DOCUMENTS

| 2007/0075733 A1* | 4/2007 | Goodnow et al. ............... 326/39 |
| 2007/0075736 A1* | 4/2007 | Goodnow et al. ............... 326/41 |
| 2008/0306721 A1* | 12/2008 | Yang ............................... 703/14 |
| 2010/0169853 A1* | 7/2010 | Jain et al. ......................... 716/5 |

* cited by examiner

*Primary Examiner* — Thuan Do
*Assistant Examiner* — Mohammed Alam
(74) *Attorney, Agent, or Firm* — Kilpatrick Townsend and Stockton LLP

(57) ABSTRACT

Methods and systems for viewing and debugging HDL designs having SystemVerilog interface constructs are provided. An HDL design code is received, wherein the design code comprises a first module, a second module and a SystemVerilog interface construct. A first object corresponding to the first module, a second object corresponding to the second module and an interface object corresponding to the interface construct are displayed in a schematic view. The interface object is disposed between the first and second objects, and a shape of the interface object is different from that of the first and second objects. The interface signals from the first object to the second object and the interface signals from the second object to the first object pass through the interface object.

21 Claims, 11 Drawing Sheets

```
                                                                        ┌─100
┌─────────────────────────────────────────────────────────────────────────┐
│  ┌ module system;                                                       │
│  │   ....                                                               │
│  │   pram_interface pram_intf();  //Declare interface                   │
│  │      CPU i_cpu(.clock,.reset(reset_cpu),                             │
│ 10│              .pram_intf(pram_intf.master)); //pass the modport "master" to the i_cpu │
│  │                                                                      │
│  │   pram i_pram(.clock,                                                │
│  │              .pram_intf(pram_intf.slave)); )); //pass the modport "slave" to the i_pram │
│  │   ....                                                               │
│  └ endmodule                                                            │
│                                                                         │
│  ┌ module CPU(input clock, reset,                                       │
│  │            pram_interface.master pram_intf);                         │
│  │   ....                                                               │
│ 20│   ....                                                              │
│  │   ....                                                               │
│  └ endmodule                                                            │
│                                                                         │
│  ┌ module pram(input clock,                                             │
│  │            pram_interface.slave pram_intf);                          │
│  │   ....                                                               │
│ 30│   ....                                                              │
│  │   ....                                                               │
│  └ endmodule                                                            │
│                                                                         │
│  ┌ interface pram_interface;                                            │
│  │   logic  VMA;                                                        │
│  │   logic  R_W;                                                        │
│  │   ubyte  ADDR;                                                       │
│ 40│   wire[7:0] DATA;                                                   │
│  │                                                                      │
│  │   modport master(output VMA, R_W, ADDR, inout DATA);                 │
│  │   modport slave(input VMA, R_W, ADDR, inout DATA);                   │
│  └ endmodule                                                            │
└─────────────────────────────────────────────────────────────────────────┘
```

FIG. 1

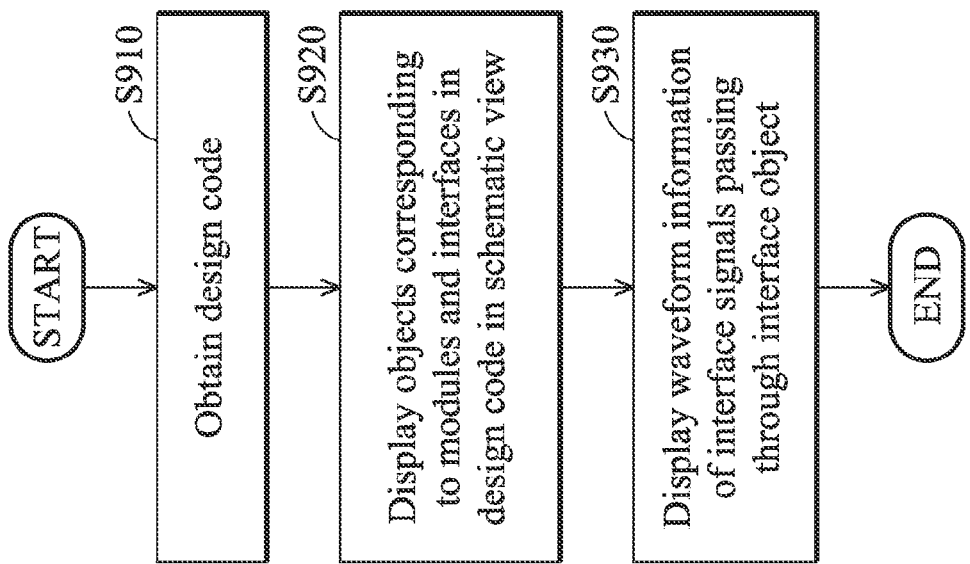

VIEWING AND DEBUGGING HDL DESIGNS HAVING SYSTEMVERILOG INTERFACE CONSTRUCTS

CROSS REFERENCE TO RELATED APPLICATIONS

This Application claims priority of U.S. Provisional Application No. 61/524,679, filed on Aug. 17, 2011, the entirety of which is incorporated by reference herein.

BACKGROUND OF THE INVENTION

1. Field of the Invention

The disclosure relates generally to verification for HDL designs, and, more particularly, verification for HDL designs which contain System Verilog "interface" constructs.

2. Description of the Related Art

In recent years, the developing process of integrated circuits such as super larger scale integrated circuits (LSIs) generally utilizes computer assisted design (CAD). According to such a developing process based on CAD, abstract circuit data, which corresponds to functions of an integrated circuit to be developed, is defined by using a so-called hardware description language (HDL), and the defined circuit SIN3 is used to form a concrete circuit structure to be mounted on a chip.

In general, a design engineer enters the description of a digital circuit in a textual format in HDL, like VHDL, Verilog, SystemC, SystemVerilog and others. SystemVerilog is an extension to Verilog 2.0, combining Hardware Description Language and Hardware Verification Language. SystemVerilog is targeted primarily at the chip implementation and verification flow, with powerful links to the system-level design flow.

BRIEF SUMMARY OF THE INVENTION

Visualization and debugging methods for HDL designs having SystemVerilog interface constructs are provided. An embodiment of a method for viewing and debugging an HDL design having SystemVerilog interface constructs is provided. An HDL design code is received, wherein the design code comprises a first module, a second module and a SystemVerilog interface construct. A first object corresponding to the first module, a second object corresponding to the second module and an interface object corresponding to the SystemVerilog interface construct are displayed in a schematic view. The interface object is disposed between the first and second objects, and the shape of the interface object is different from that of the first and second objects. The interface signals from the first object to the second object and the interface signals from the second object to the first object pass through the interface object.

Furthermore, an embodiment of a system for viewing and debugging an HDL design having SystemVerilog interface constructs is provided. The system comprises a processing unit and a display unit coupled to the processing unit. The processing unit receives an HDL design code, wherein the design code comprises a first module, a second module and a SystemVerilog interface construct. The processing unit controls the display unit to open a schematic view, and displays a first object corresponding to the first module, a second object corresponding to the second module and an interface object corresponding to the interface construct in the schematic view. The interface object is disposed between the first and second objects, and a shape of the interface object is different from that of the first and second objects. The interface signals from the first object to the second object and the interface signals from the second object to the first object pass through the interface object.

A detailed description is given in the following with reference to the accompanying drawings.

BRIEF DESCRIPTION OF DRAWINGS

The invention can be more fully understood by reading the subsequent detailed description and examples with references made to the accompanying drawings, wherein:

FIG. 1 shows an example of design code in Verilog having an interface construct;

FIG. 9 shows a management method for interface signals according to another embodiment of the invention, wherein the management method is performed by the system of FIG. 2;

DETAILED DESCRIPTION OF THE INVENTION

Figure 2:
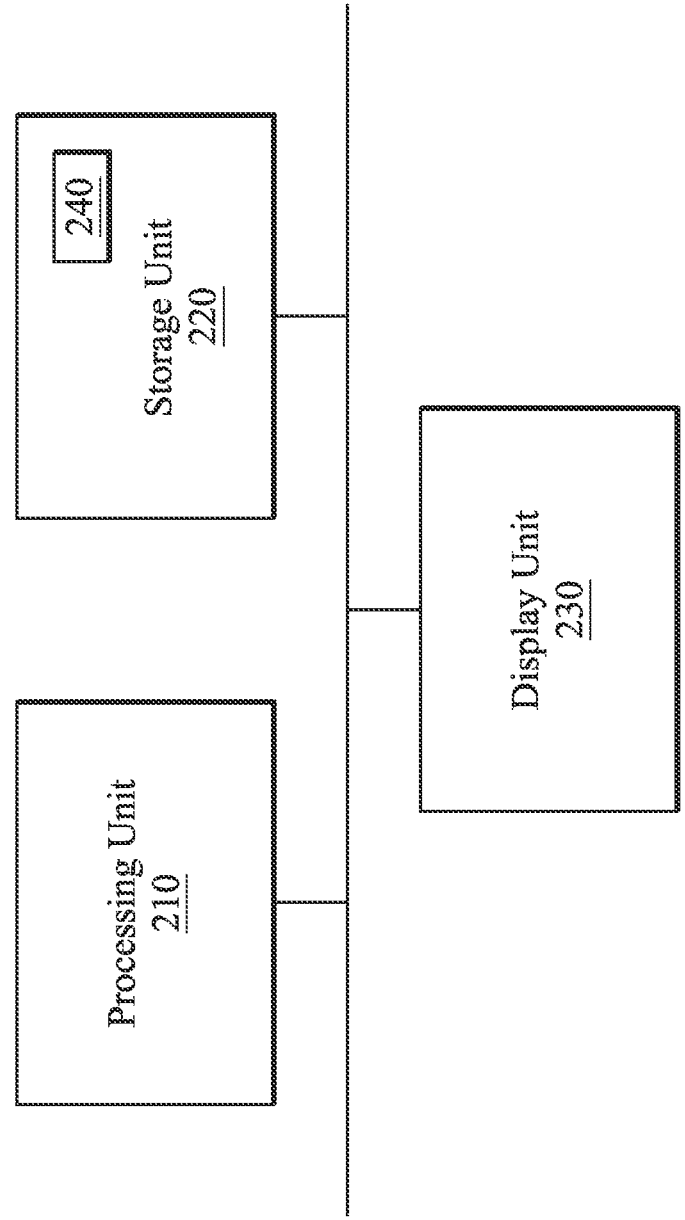
FIG. 2 shows a block diagram illustrating an embodiment of a system for managing interface signals between various modules according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

To facilitate the system level design, SystemVerilog introduced a new language construct called "interface" which was not in earlier versions of the Verilog language. So strictly speaking, when referring to the interface construct, one should quote it as SystemVerilog interface construct. However, in order to simplify the discussion, we may just refer to it as Verilog interface construct in the following text. Furthermore, an HDL design may be specified in a combination of different languages, such as SystemVerilog, earlier versions of Verilog languages, VHDL, SystemC and etc. In order to simplify the discussion, we may just refer to "HDL designs" as "Verilog designs", "HDL designs having SystemVerilog interface constructs" as "Verilog designs having interface constructs" and etc. in the following text. It is to be understood that such simplification is merely for discussion clarity, and is in no means of limiting the scope of the current invention.

Interface is a construct in Verilog, which is a named bundle of nets or variables that encapsulates the connectivity between various modules. In an interface construct, "modport" is used to define a specific port that is used to customize interface signals between modules. An example illustrating an interface definition that defines the interface signals between a first module and a second module is given below.

interface first_second_interface;
        logic SIN1;
        ubyte SIN2;
        wire [7:0] SIN3;
        modport firstport(output SIN1, SIN2, inout SIN3);
        modport secondport(input SIN1, SIN2, inout SIN3);
    endinterface In the interface definition, the variables SIN1, SIN2 and SIN3 are used to represent the interface signals between the first and second modules. Furthermore, "modport" defines a module port, wherein the modport "firstport" and the modport "secondport" are used to define direction information of the interface signals SIN1, SIN2 and SIN3 for the first and second modules, respectively. For example, the modport "firstport" is used to define that the interface signals SIN1 and SIN2 represent output signals and the interface signal SIN3 represents an input/output signal (i.e. bidirectional) for the module connecting to it, and the modport "secondport" is used to define that the interface signals SIN1 and SIN2 represent input signals and the variable SIN3 represents an input/output signal (i.e. bidirectional) for the module connecting to it. It is understood that the above manners for defining the interface are only examples of the present application, and do not limit the invention.

FIG. 1 shows an example of design code 100 coding in Verilog. Design code 100 comprises system module 10, CPU module 20, RAM module 30 and interface 40. In design code 100, system module 10 is a top module at the top hierarchical level, wherein the top module describes the connectivity relationship of CPU module 20, RAM module 30 and interface 40. In design code 100, interface 40 is used to manage the interface signals between CPU module 20 and RAM module 30. Furthermore, CPU module 20 is a master module and RAM module 30 is a slave module. In order to simplify the description, design code 100 only uses modules 10, 20, 30 and 40 to illustrate an interface function. However, a design code of an integrated circuit (IC) may comprise a great quantity of modules in actual design, and various interfaces can be used to connect the great quantity of modules. In interface 40, variables VMA, R_W, ADDR and DATA are used to represent the interface signals between CPU module 20 and RAM module 30. For example, interface signal VMA may be a chip select signal, interface signal R_W may be a read/write signal, interface signal ADDR may be a multi-bits signal with address information and DATA may be a multi-bits signal with data information. Furthermore, modport "master" and modport "slave" further define the direction information of the interface signals for CPU module 20 and RAM module 30, respectively. For example, modport "master" is used to define that interface signals VMA, R_W, ADDR are output signals and interface signal DATA is an input/output signal (i.e. bidirectional) for CPU module 20, and modport "slave" is used to define that interface signals VMA, R_W, ADDR are input signals and interface signal DATA is an input/output signal for RAM module 30. In system module 10, an interface instance "pram_intf( )" is declared to instantiate interface 40 for the interface signals between CPU module 20 and RAM module 30. Thus, only three ports (i.e. clock, reset and pram_intf) are needed on CPU module 20, and only two ports (i.e. clock and pram_intf) are needed on RAM module 30. Furthermore, port pram_intf of "i_cpu" is used to pass module port "master" of interface 40 to CPU module 20 for transferring of interface signals VMA, R_W, ADDR and DATA, and port pram_intf of "i_pram" is used to pass module port "slave" of interface 40 to RAM module 30 for transferring of interface signals VMA, R_W, ADDR and DATA. Thus, interface signals VMA, R_W, ADDR and DATA can be managed through interface 40.

FIG. 2 shows a block diagram illustrating an embodiment of a system 200 for managing interface signals between various modules according to the invention. The system 200 can be implemented in an electronic device having a display, such as a computer system. The system 200 comprises a processing unit 210, a storage unit 220 and a display unit 230. The system 200 can be used to verify designs, such as chip designs. For example, a design code 240 coded in Verilog (e.g. design code 100 of FIG. 1) is stored in the storage unit 220. The processing unit 210 can perform a management method for managing interface signals between various modules of the design code 240 so as to verify the design code 240, which will be discussed further in the following paragraphs. Furthermore, the system 200 displays related information generated by the processing unit 210 on the display unit 230.

Figure 3:
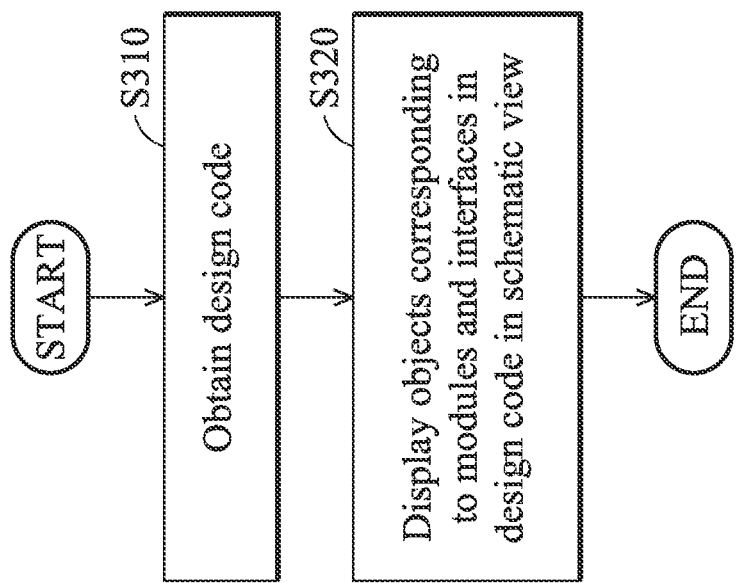
FIG. 3 shows a management method for interface signals according to an embodiment of the invention, wherein the management method is performed by the system of FIG. 2.

FIG. 3 shows a management method for interface signals according to an embodiment of the invention, wherein the management method is performed by the system 200 of FIG. 2. Referring to FIG. 2 and FIG. 3 together, first, a design code stored in the storage unit 220 is received by the processing unit 210 (step S310), wherein the design code is coded in Verilog and the design code comprises at least two modules and an interface for managing the interface signals between the two modules. In the embodiment, the design code 100 of FIG. 1 is used as an example received by the processing unit 210. As described above, the design code 100 of FIG. 1 comprises CPU module 20, RAM module 30 and interface 40, wherein the connectivity relationship of modules 20, 30 and interface 40 are described in system module 10. Next, the processing unit 210 controls the display unit 230 to open a schematic view, and displays a plurality of objects on the schematic view (step S320), wherein each object corresponds to an individual module or instance of the design code 100.

Figure 4:
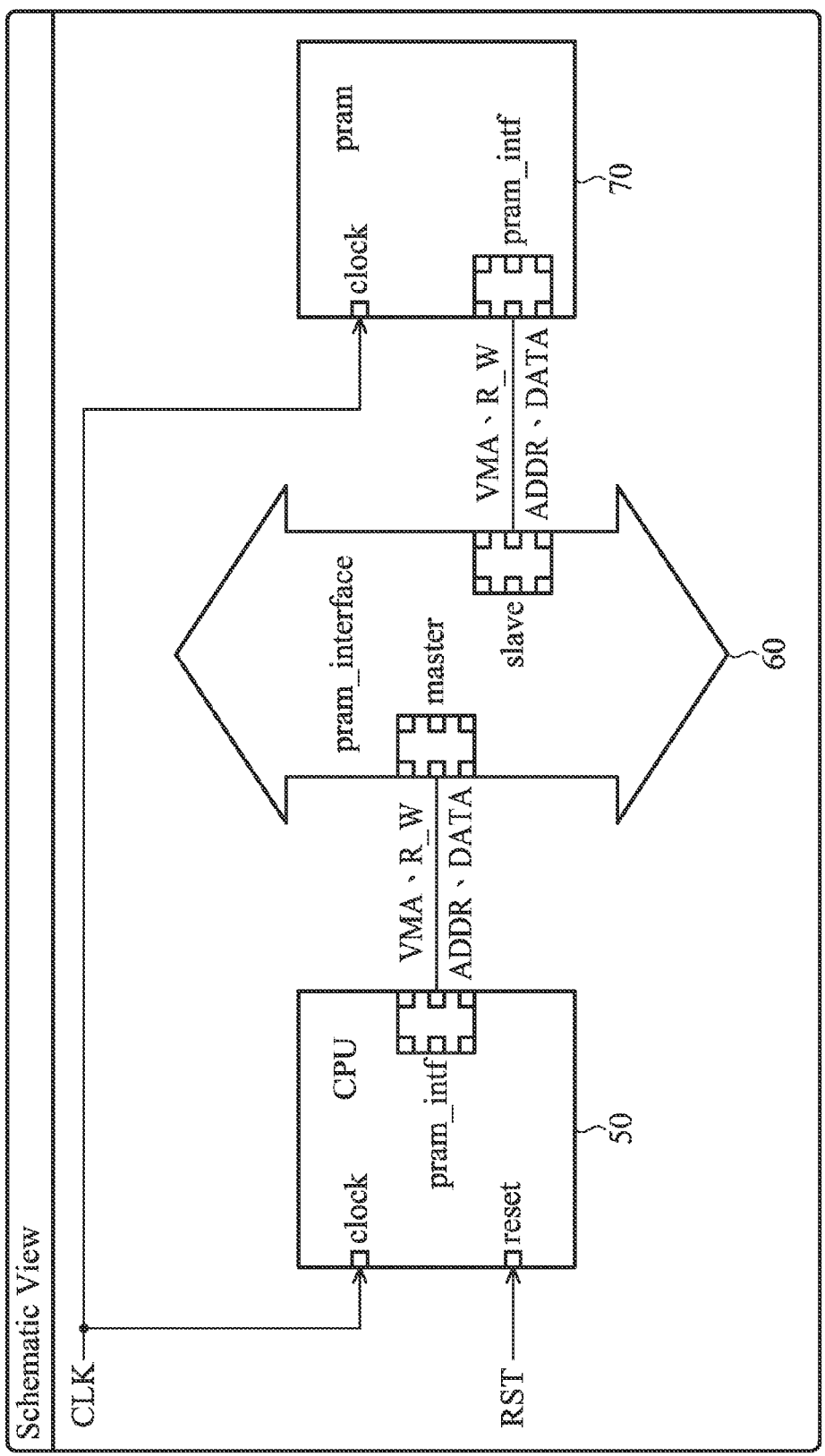
FIG. 4 shows a schematic view illustrating the objects corresponding to the modules and interfaces of the design code of FIG. 1 according to an embodiment of the invention.

FIG. 4 shows a schematic view illustrating the objects corresponding to the modules and the interface of the design code 100 of FIG. 1 according to an embodiment of the invention. Referring to FIG. 1 and FIG. 4 together, a CPU object 50 corresponds to CPU module 20, an interface object 60 corresponds to interface 40, and a RAM object 70 corresponds to RAM module 30, wherein the shape of interface object 60 is different from that of CPU object 50 and RAM object 70. In the embodiment, the shape of interface object 60 is a double arrow, and each shape of CPU object 50 and RAM object 70 is a rectangle. Thus, users can recognize the interface object 60 easily. A clock signal CLK is provided to ports "clock" of CPU object 50 and RAM object 70, and a reset signal RST is provided to port "reset" of CPU object 50. Furthermore, a module port "pram_intf" of CPU object 50 is connected to module port "master" of the interface object 60, and a module port "pram_intf" of RAM object 70 is connected to module port "slave" of the RAM object 70. Thus, interface signals between CPU object 50 and RAM object 70 can be transferred through interface object 60. Furthermore, module port "pram_intf" of RAM object 70 and module port "pram_intf"

of CPU object 50 have the same shape, which is different from that of the normal ports thereof (e.g. "clock" or "reset"). In addition, module ports "master" and "slave" of interface object 60 have shapes which are similar to module ports "pram_intf" of CPU object 50 and RAM object 70. Specifically, the interface object 60 and the module ports of objects 50, 60 and 70 have specific shapes in the schematic, thus users can distinguish them conveniently. It is noted that the shapes of the interface object 60 and the module ports of the objects 50, 60 and 70 are used as examples for description, and do not limit the invention.

As shown in design code 100 of FIG. 1, direction information of the interface signals is defined in interface module 40, as shown in the following:

modport master(output VMA, R_W, ADDR, inout DATA); and
modport slave(input VMA, R_W, ADDR, inout DATA).

As described above, the direction information illustrates that interface signals VMA, R_W and ADDR are the signals from CPU object 50 to RAM object 70 via the interface object 60, and interface signal DATA is a bidirectional signal between CPU object 50 and RAM object 70 via interface object 60. Therefore, a quantity of the output signals (e.g. VMA, R_W, ADDR and DATA) is larger than a quantity of the input signals (e.g. DATA) for the module port "master" of the interface object 60, and a quantity of the output signals (e.g. DATA) is smaller than a quantity of the input signals (e.g. VMA, R_W, ADDR and DATA) for the module port "slave" of the interface object 60. Thus, the module port "master" is disposed on one side (e.g. left side) of the interface object 60 and the module port "slave" is disposed on another side (e.g. right side) of the interface object 60. In the embodiment, module ports "master" and "slave" are disposed on opposite sides of the interface object 60. According to the arrangements for module ports "master" and "slave", interface object 60 is disposed between the CPU object 50 and the RAM object 70, wherein the CPU object 50 is disposed on the side of module port "master" of interface object 60 and the RAM object 70 is disposed on the side of module port "slave" of interface object 60. For example, in the embodiment, CPU object 50 is disposed on the lefthand side of interface object 60, and RAM object 70 is disposed on the righthand side of interface object 60. It is noted that the configurations of the objects and the module ports are used as examples for description, and do not limit the invention. Furthermore, for a module port of an interface object, an object coupled to the module port of the interface object is defined as a master (driver) object when a quantity of output signals is larger than a quantity of input signals passing through the module port, and a module of the design code corresponding to the master (driver) object is defined as a master (driver) module. On the other hand, an object coupled to the module port of the interface object is defined as a slave (load) object when a quantity of input signals is larger than a quantity of output signals passing through the module port, and a module of the design code corresponding to the slave (load) object is defined as a slave (load) module. In general, a master object is disposed to the left of a slave object in a schematic view. In FIG. 4, by disposing the module ports "master" and "slave" on different sides of the interface object 60 and by disposing CPU object 50 and RAM object 70 on different sides outside of interface object 60 based on the positions of module ports "master" and "slave", it is easy for users to distinguish between a master (driver) object and a slave (load) object.

Figure 5:
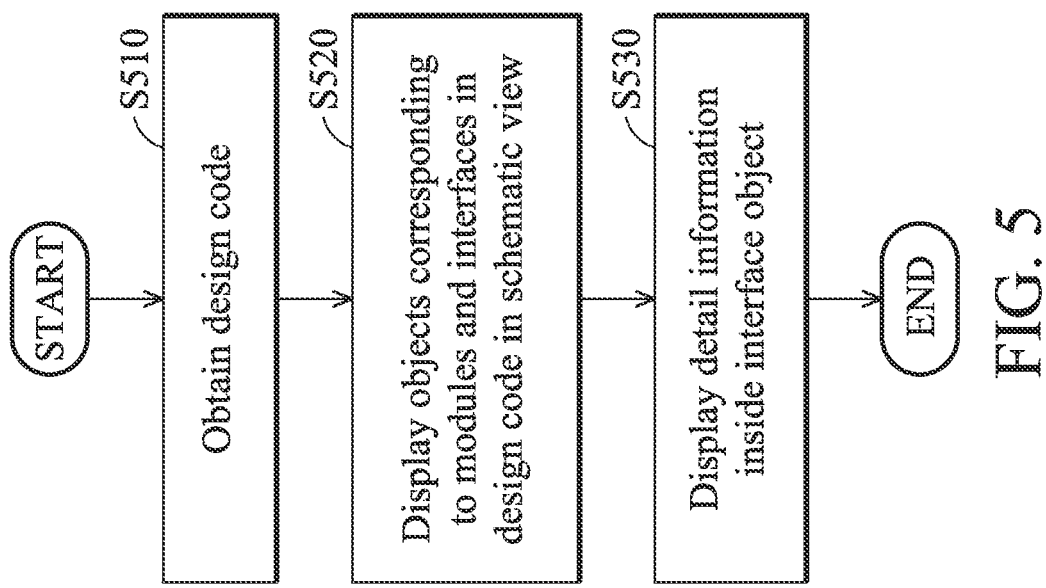
FIG. 5 shows a management method for interface signals according to another embodiment of the invention, wherein the management method is performed by the system of FIG. 2.

FIG. 5 shows a management method for interface signals according to another embodiment of the invention, wherein the management method is performed by the system 200 of FIG. 2. Referring to FIG. 2 and FIG. 5 together, first, a design code stored in the storage unit 220 is received by processing unit 210 (step S510), wherein the design code is coded in Verilog and the design code comprises at least two modules and an interface construct for managing the interface signals between the two modules. In the embodiment, design code 100 of FIG. 1 is used as an example of the design code received by processing unit 210. As described above, design code 100 of FIG. 1 comprises CPU module 20, RAM module 30 and interface 40, wherein the connectivity relationship of modules 20, 30 and interface 40 are described in the system module 10. Next, processing unit 210 controls display unit 230 to open a schematic view, and displays CPU object 50 corresponding to CPU module 20, interface object 60 corresponding to interface 40 and RAM object 70 corresponding to RAM module 30 in the schematic view (step S520), as shown in FIG. 4. Next, detail information inside interface object 60 is displayed in the same schematic view or a new schematic view when interface object 60 is selected (step S530). For example, if a user double clicks interface object 60 in the schematic view displayed on display unit 230, processing unit 210 further displays connectivity information of the interface signals VMA、R_W、ADDR and DATA.

Figure 6:
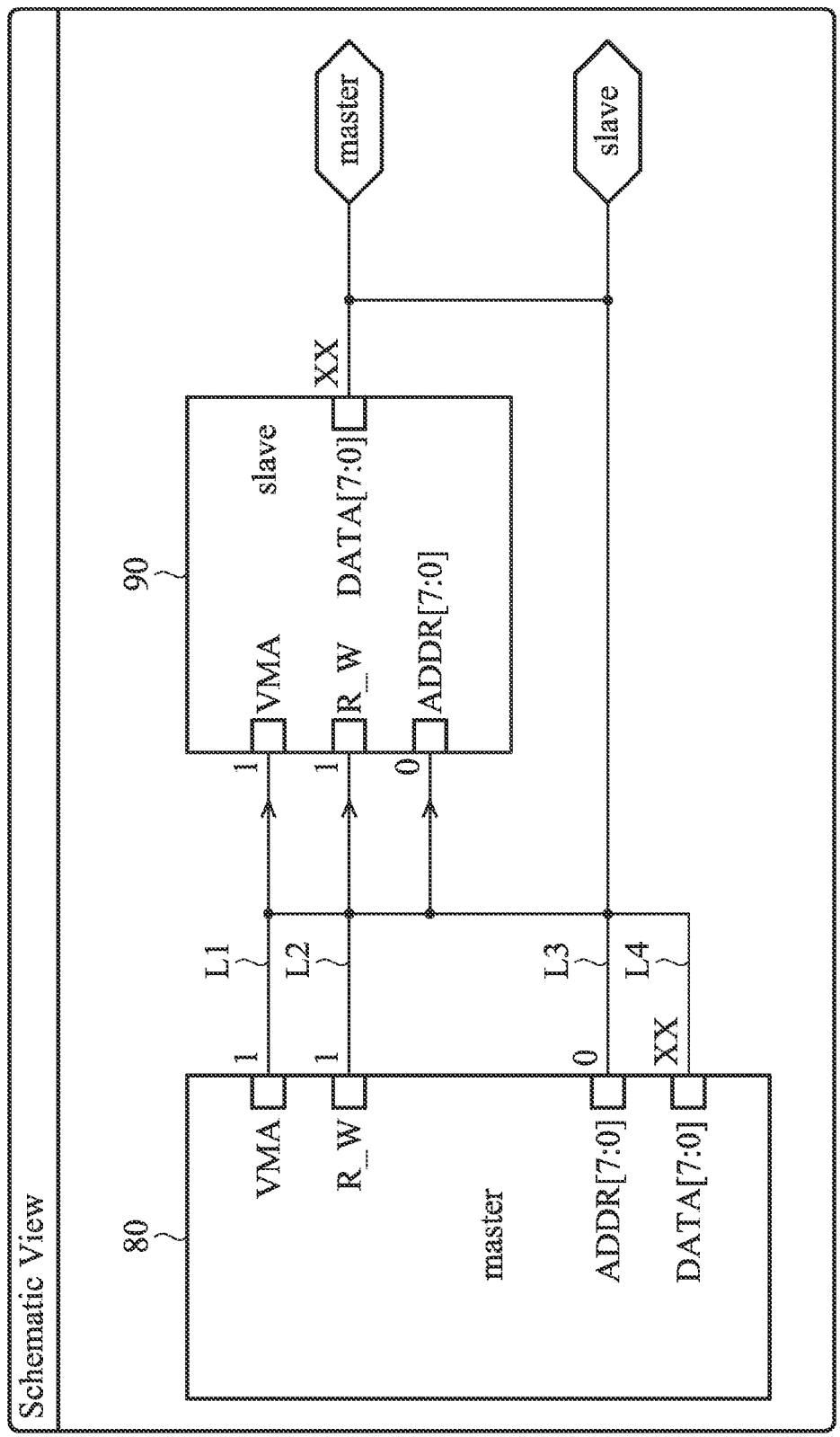
FIG. 6 shows a schematic view illustrating detailed information inside the interface object of FIG. 4 according to an embodiment of the invention.

FIG. 6 shows a schematic view illustrating detailed information inside of the interface object 60 of FIG. 4 according to an embodiment of the invention. Referring to FIG. 4 and FIG. 6 together, an object 80 corresponds to module port "master" of interface object 60 and an object 90 corresponds to module port "slave" of interface object 60. In the embodiment, each shape of object 80 and object 90 is a rectangle. Furthermore, the ports of objects 80 and 90 are disposed based on the directions of the interface signals. For example, port "VMA" on object 80 is connected to port "VMA" on object 90 via connection line L1 for transferring of the interface signal VMA; port "R_W" on object 80 is connected to port "R_W" on object 90 via connection line L2 for transferring of the interface signal R_W; port "ADDR[7:0]" on object 80 is connected to port "ADDR[7:0]" on object 90 via connection line L3 for transferring of the interface signal ADDR; and port "DATA[7:0]" on object 80 is coupled to port "DATA [7:0]" on object 90 via connection line L4 for transferring of the interface signal DATA. Furthermore, connection lines L1, L2, L3 and L4 are connected to the module ports "master" and "slave". In object 80, ports "VMA", "R_W", and "ADDR[7:0]" are disposed on the right side due to these ports being output ports. In addition, in object 90, ports "VMA", "R_W", and "ADDR[7:0]" are disposed on the left side due to these ports being input ports. In the embodiment, the port "DATA [7:0]" is an input/output port and is disposed on the right side of object 80 and object 90. In general, an input port is disposed on the left side of an object and an output port is disposed on the right side of an object in a schematic view. Meanwhile, simulation values of the interface signals may be displayed on the corresponding connection lines in the embodiment. In FIG. 6, the simulation values for interface signals VMA, R_W, ADDR and DATA displayed on the connection lines L1, L2, L3 and L4 are "1", "1", "0" and "XX", respectively, wherein "X" represents an unknown value.

Figure 7:
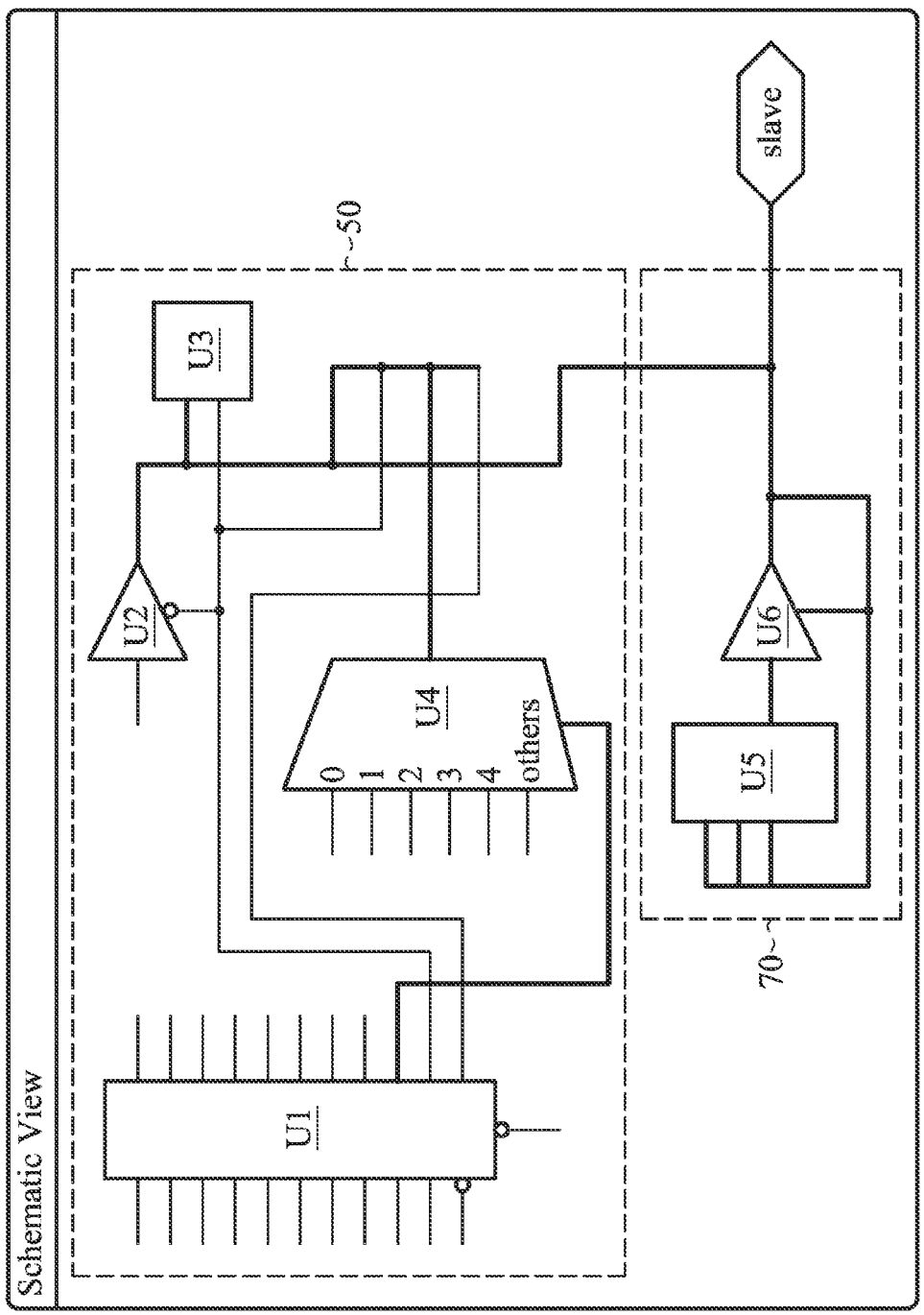
FIG. 7 shows a schematic view illustrating a traced result of the module port "slave" of FIG. 6

A user can select any connection line or any port in a schematic view to trace driver, load, or connectivity relationship corresponding to the selected connection line or port. In one embodiment, the selected connection line or port is highlighted in the schematic view, and the traced result is displayed in a new schematic view. FIG. 7 shows a schematic view illustrating a traced result of module port "slave" of FIG. 6, wherein the objects U1, U2, U3 and U4 inside CPU object 50 and the objects U5 and U6 inside RAM object 70 of FIG.

Figure 8B:
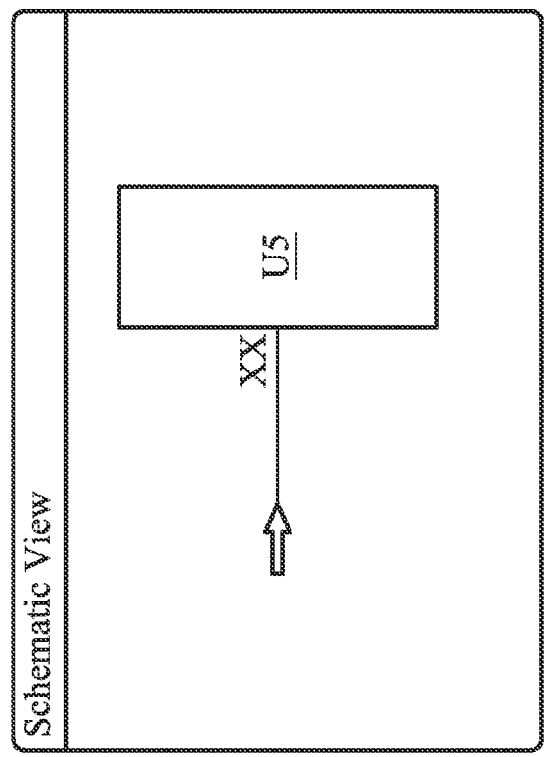
FIG. 8B shows a schematic view illustrating another traced result of wire L3 of FIG. 6.
Figure 8A:
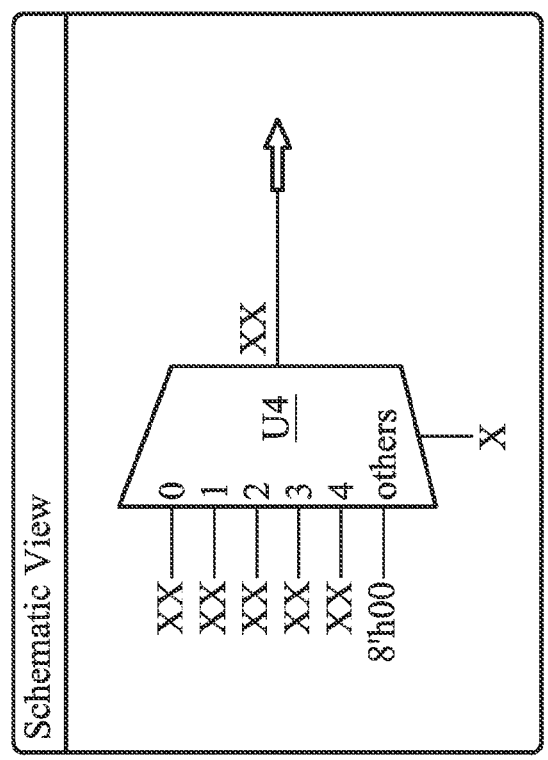
FIG. 8A shows a schematic view illustrating a traced result of wire L3 of FIG. 6.

4 connected to the selected module port "slave" are shown in the schematic view. FIG. 8A shows a schematic view illustrating a traced result of connection line L3 of FIG. 6, wherein the driver (i.e. object U4 of CPU object 50) of connection line L3 is shown. FIG. 8B shows a schematic view illustrating another traced result of connection line L3 of FIG. 6, wherein the load (i.e. object U5 of RAM object 70) of connection line L3 is shown. Specifically, a user can trace the driver, load and connectivity relationship of each interface signal inside or outside of an interface object according to the embodiments of the invention.

FIG. 9 shows a management method for interface signals according to another embodiment of the invention, wherein the management method is performed by the system 200 of FIG. 2. Referring to FIG. 2 and FIG. 9 together, first, a design code stored in storage unit 220 is received by processing unit 210 (step S910), wherein the design code is in Verilog and the design code comprises at least two modules and an interface for managing the interface signals between the two modules. In the embodiment, the design code 100 of FIG. 1 is used as an example of the design code received by the processing unit 210. As described above, design code 100 of FIG. 1 comprises CPU module 20, RAM module 30 and interface 40, wherein the connectivity relationships of modules 20, 30 and interface 40 are described in system module 10. Next, the processing unit 210 controls the display unit 230 to display a schematic view showing CPU object 50 corresponding to CPU module 20, interface object 60 corresponding to interface 40 and RAM object 70 corresponding to RAM module 30 in the schematic view (step S920), as shown in FIG. 4. Next, waveform information of the interface signals passing through interface object 60 are displayed in a waveform view (step S930). For example, a user can drag and drop the interface object 60 of FIG. 4 to a waveform view, to observe simulation values of the interface signals passing through interface object 60.

Figure 10:
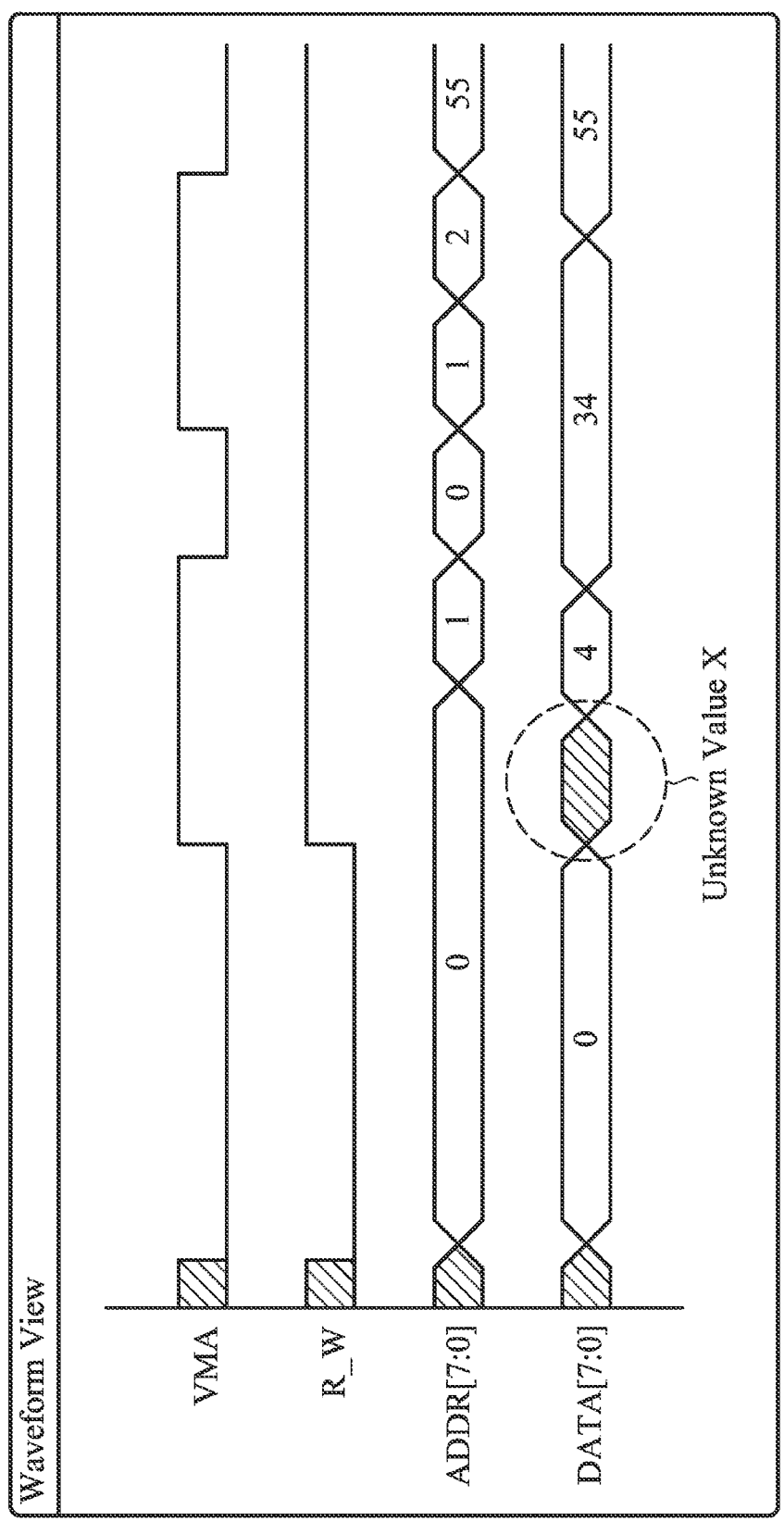
FIG. 10 shows a waveform view illustrating waveform information of the interface object of FIG. 4 according to an embodiment of the invention.

FIG. 10 shows a waveform view illustrating waveform information of interface object 60 of FIG. 4 according to an embodiment of the invention. In FIG. 10, interface signals VMA, R_W, ADDR and DATA are shown in the waveform view when interface object 60 of FIG. 4 is dragged and dropped to a waveform view window. Furthermore, a user can select an unknown value "X" shown in the waveform view to trace the driver that causes the unknown value. For example, when an unknown value "X" on interface signal DATA is selected, a driver object that provides the interface signal DATA is shown in a schematic view, such as the driver object U4 of FIG. 8A. Therefore, through interaction between the waveform view of FIG. 10 and the schematic view of FIG. 4, the user can verify the design code conveniently.

Figure 11:
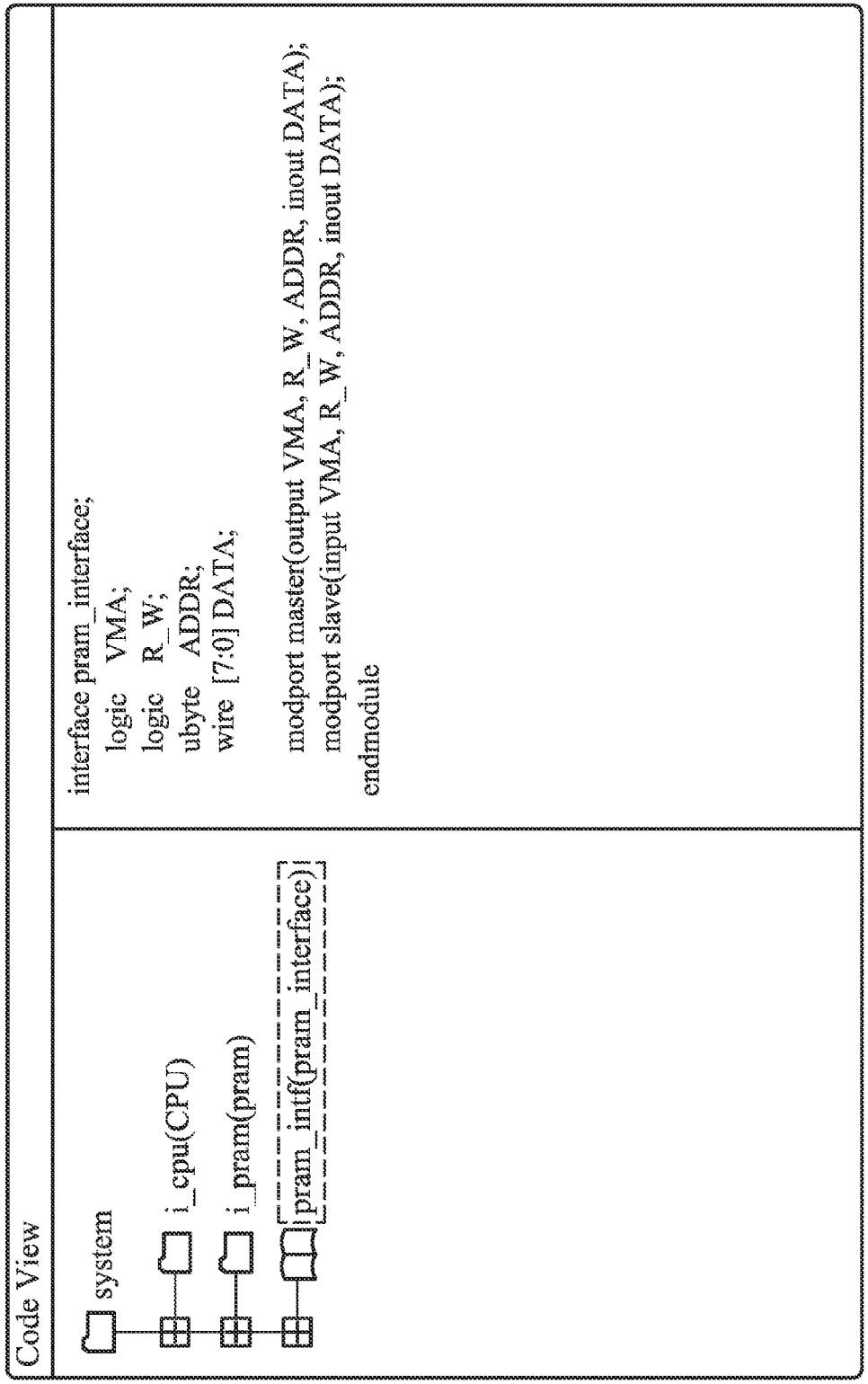
FIG. 11 shows a code view illustrating the design code and hierarchical structure thereof according to an embodiment of the invention.

Furthermore, the user can verify the design code through interaction between the schematic view of FIG. 4 and the code view of FIG. 11. In FIG. 11, design code 100 of FIG. 1 and its hierarchical structure are shown. When interface object 60 in the schematic view of FIG. 4 is selected, the design code corresponding to interface 40 will be listed in the code view, as shown in FIG. 11.

Management methods for interface signals, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A computer implemented method for viewing and debugging an HDL design having SystemVerilog interface constructs, comprising:
   receiving, with one or more processors associated with a computer, an HDL design code, wherein the design code comprises a first module, a second module and a SystemVerilog interface construct; and
   displaying, with the one or more processors, a first object corresponding to the first module, a second object corresponding to the second module and an interface object corresponding to the SystemVerilog interface construct in a schematic view,
   wherein the interface object is disposed between the first and second objects,
   wherein interface signals from the first object to the second object and interface signals from the second object to the first object pass through the interface object.

2. The computer implemented method as claimed in claim 1, wherein a shape of the interface object is a double arrow, and each shape of the first and second objects is a rectangle.

3. The computer implemented method as claimed in claim 1, wherein the first object has a first module port coupled to a second module port of the interface object for transferring of the interface signals between the first and second objects, and the second object has a third module port coupled to a fourth module port of the interface object for transferring of the interface signals between the first and second objects, wherein the first and third module ports have the same shape, which is different from other ports of the first and second object.

4. The computer implemented method as claimed in claim 3, wherein the shapes of the first, second, third and fourth module ports are identical.

5. The computer implemented method as claimed in claim 3, wherein the second and fourth module ports are disposed on the first and second sides of the interface object, and the first object is disposed on the outside of the second module port of the interface object and the second object is disposed on the outside of the fourth module port of the interface object, wherein the second side is opposite to the first side on the interface object.

6. The computer implemented method as claimed in claim 5, wherein the first module is a master or driver module and the second module is a slave or load module when a quantity of the interface signals from the first object to the second object is larger than that of the interface signals from the second object to the first object, and the second and fourth module ports are disposed on the left hand side and the right hand side of the interface object, respectively.

7. The computer implemented method as claimed in claim 1, further comprising:
  selecting, with the one or more processors, the interface object to display connectivity information of all of the interface signals and module ports inside the interface object.

8. The computer implemented method as claimed in claim 7, wherein the step of selecting the interface object to display connectivity information of all the interface signals and module ports inside the interface object further comprises:
  annotating, with the one or more processors, simulation values on the interface signals.

9. The computer implemented method as claimed in claim 7, further comprising:
  selecting, with the one or more processors, one connection line or one module port to trace connectivity thereof; and
  displaying, with the one or more processors, the traced result.

10. The computer implemented method as claimed in claim 9, wherein the traced result comprises the objects inside the module objects that are connected to the selected connection line or the selected module port.

11. The computer implemented method as claimed in claim 1, further comprising:
  selecting, with the one or more processors, the interface object to display waveform information of the interface signals in a waveform view.

12. The computer implemented method as claimed in claim 11, further comprising:
  selecting, with the one or more processors, one waveform that represents an unknown value in the waveform view to trace the interface signal that causes the unknown value; and
  displaying, with the one or more processors, a driver object of the traced interface signal in the schematic view.

13. The computer implemented method as claimed in claim 1, further comprising:
  selecting, with the one or more processors, the interface object to display the code of the SystemVerilog interface construct in a code view.

14. A system for viewing and debugging an HDL design having SystemVerilog interface constructs, comprising:
  a processing unit, receiving an HDL design code, wherein the design code comprises a first module, a second module and a SystemVerilog interface construct; and
  a display unit coupled to the processing unit,
  wherein the processing unit controls the display unit to open a schematic view, and displays a first object corresponding to the first module, a second object corresponding to the second module and an interface object corresponding to the interface construct in the schematic view,
  wherein the interface object is disposed between the first and second objects,
  wherein the interface signals from the first object to the second object and the interface signals from the second object to the first object pass through the interface object.

15. The system as claimed in claim 14, wherein a shape of the interface object is a double arrow, and each shape of the first and second objects is a rectangle.

16. The system as claimed in claim 14, wherein the first object has a first module port coupled to a second module port of the interface object for transferring of the interface signals between the first and second objects, and the second object has a third module port coupled to a fourth module port of the interface object for transferring of the interface signals between the first and second objects, wherein the first and third module ports have the same shape, which is different from other ports of the first and second object.

17. The system as claimed in claim 16, wherein the shapes of the first, second, third and fourth module ports are identical.

18. The system as claimed in claim 16, wherein the second and fourth module ports are disposed on the first and second sides of the interface object, and the first object is disposed on the outside of the second module port of the interface object and the second object is disposed on the outside of the fourth module port of the interface object, wherein the second side is opposite to the first side on the interface object.

19. The system as claimed in claim 18, wherein the first module is a master or driver module and the second module is a slave or load module when a quantity of the interface signals from the first object to the second object is larger than that of the interface signals from the second object to the first object, and the second and fourth module ports are disposed on the left hand side and the right hand side of the interface object, respectively.

20. The computer implemented method as claimed in claim 1, wherein a shape of the interface object is different from that of the first and second objects.

21. The system as claimed in claim 14, wherein a shape of the interface object is different from that of the first and second objects.

* * * * *